United States Patent [19]

Broer et al.

[11] 4,259,435

[45] Mar. 31, 1981

[54] ADDITIVE METHOD OF MANUFACTURING METAL PATTERNS ON SYNTHETIC RESIN SUBSTRATES

[75] Inventors: Dirk J. Broer; Arnoldus J. M. van den Broek, both of Eindhoven, Netherlands

[73] Assignee: U.S. Philips Corporation, New York, N.Y.

[21] Appl. No.: 50,737

[22] Filed: Jun. 21, 1979

[30] Foreign Application Priority Data

Jun. 23, 1978 [NL] Netherlands .......................... 7806773

[51] Int. Cl.$^3$ ............................................... G03C 5/00
[52] U.S. Cl. ..................................... 430/313; 430/315; 430/324; 430/406; 430/414; 430/494
[58] Field of Search ............... 430/314, 315, 494, 313, 430/324, 406, 414; 427/98, 304

[56] References Cited

U.S. PATENT DOCUMENTS

| 3,562,005 | 2/1971 | De Angelo et al. ................. 430/314 |
| 3,772,078 | 11/1973 | Polichette et al. .................. 430/315 |
| 3,801,320 | 4/1974 | Erickson ............................... 430/494 |
| 4,112,139 | 9/1978 | Shirk et al. ........................... 427/304 |

OTHER PUBLICATIONS

Feldstein, Selective Electroless Plating Techniques: A Survey, RCA Laboratories, Princeton, N.J., Aug., 1970.

Primary Examiner—J. Travis Brown
Attorney, Agent, or Firm—Norman N. Spain

[57] ABSTRACT

Additive method of manufacturing metal patterns on synthetic resin substrates, printed circuits in particular. A nuclear image of a desired pattern is obtained by means of a salt of a metal which may occur in more than one valency and a noble metal salt by inactivating the substrate area outside the desired pattern by photo-oxidation by means of exposure to light in the presence of oxygen. The ultimate metal pattern is deposited by electroless metal deposition on the nuclear image.

2 Claims, No Drawings

ADDITIVE METHOD OF MANUFACTURING METAL PATTERNS ON SYNTHETIC RESIN SUBSTRATES

The invention relates to a method of additively manufacturing metal patterns on substrates consisting of a synthetic resin, particularly to a method of manufacturing printed circuits and to products obtained by means of this method.

United States Patent Specification No. 3,562,038 discloses a method by means of which the surface of a substrate is treated to obtain surface portions capable of retaining a colloidal catalyst to a greater extent than the other portions of the surface, whereafter the surface is contacted with a colloidal solution of a noble metal catalyst and thereafter with a solvent for a period of time which is sufficiently long to remove all the colloidal catalyst from the treated surface portions, whereafter these last-mentioned surface portions are intensified by electroless metal plating to form the desired metal pattern.

One of the possible way of obtaining the desired selective retentiviness of given surface portions relative to the remaining surface of the substrate with respect to the removability of the colloidal catalyst is oxidising of the substrate surface in accordance with the ultimately desired metal pattern. Other possibilities are the selective mechanical roughening of the surface, for example by means of sand blasting, abrasion with an abrasive or by making an otherwise hydrophilic surface hydrophobic, etc. Before treating the surface of the substrate to provide areas having different degrees of retentiveness for the catalyst this surface is first coated with masking material in a negative pattern with respect to the desired conductor pattern. This can be done by silk screening or by means of a photoresist.

The above described method requires a large number of processing stages and is, consequently, not very attractive.

It is an object of the invention to provide a method which is considerably simpler than the above-mentioned method.

It is based on a known reaction at polymer surfaces, namely photo-oxidation, such as described in, inter alia, the handbook by B. Ranby and J.F Rabek "Photo-degradation, Photo-oxidation and Photo-stabilisation of Polymers", John Wiley and Sons, London, New-York 1975, chapter 3 pages 97-108 in particular. In accordance with the mechanism of this type of reaction carbon chains at the surface of polymers when irradiated in the presence of oxygen and disrupted and peroxide groups are formed at that point. On that handbook 2.1 on pages 45-48 shows the dissociation energy of a great number of atom groups.

According to the invention there is provided a synthetic resin method of additively manufacturing a metal pattern on a substrate of which at least a major surface consists of a synthetic resin. The method of the invention comprises the; steps of irradiating the synthetic resin with actinic light in accordance with a negative of the desired metal pattern in the presence of oxygen so as to form peroxide groups on the surface of the synthetic resin, contacting the irradiated synthetic resin surface with a solution of dispersion of an oxide or salt of a bivalent or multivalent metal; in which oxide or salt the metal is present in a lower valency nobel metal ions to metal and thereby rendering state thus being capable of reducing; the irradiated areas inactive, then contacting the synthetic resin with a solution containing noble metal ions so as to form a nuclear nobel metal image in a pattern of the desired metal pattern, and then intensifying the nuclear noble metal image by electroless metal deposition so as to form the desired metal pattern.

A great number of synthetic resin materials were tested during the investigations which led to the invention. In principle they are all capable of forming an image having a reasonable or a good resolution and, after electroless deposition of nickel or copper, a reasonably or excellently adhering pattern. Rather widely divergent doses of radiant energy are required.

The following Table contains a list of a number of synthetic resin materials together with the results obtained therewith and the required doses of radiation, supplied by a SP 500 (500W) water-cooled high-pressure mercury vapour lamp. The signs +(good), +(reasonable) and −(poor) are used in the Table to indicate the quality of the image resolution and if the adhesion between the metal pattern and the substrate.

| Polymer | radiation density (J/cm$^2$) | metallizing bath | image | resolution | adhesion |
|---|---|---|---|---|---|
| Polyimide | 24 | Ni | none | | |
| "Kapton H" | 48 | Ni | pos. | − | +/+ |
| of Dupont | 96 | Ni | pos. | ± | +/± |
| | 192 | Ni | pos. | +/± | +/± |
| | 288 | Ni | pos. | +/± | +/± |
| | 662 | Ni | pos. | − | + |
| | 96 | Cu | pos. | − | − |
| | 192 | Cu | pos. | ± | − |
| poly-p-xylylene "Parylene N" of Union Carbide | 12 | Ni | pos. | ± | +/± |
| | 56 | Ni | pos. | ± | +/± |
| | 84 | Ni | pos. | ++ | +/± |
| poly-chloro p-xylylene "Parylene C" | 8 | Ni | neg. | − | ± |
| | 24 | Ni | pos. | ±/− | ± |
| | 48 | Cu | pos. | − | − |
| | 96 | Cu | pos. | ± | − |
| | 192 | Cu | pos. | + | − |
| poly-dichloro p-xylylene "Parylene D" | 9 | Ni | none | | |
| | 42 | Ni | pos. | + | + |
| | 56 | Ni | pos. | ± | + |
| polymethyl-methacrylate | 28 | Ni | pos. | + | + |
| | 84 | Ni | pos. | ± | + |
| polystyrene | 24 | Ni | neg. | − | −/± |
| | 48 | Ni | neg. | − | −/± |
| | 288 | Ni | none | | |
| | 662 | Ni | pos. | ± | ± |
| phenolformaldehyde-resin paper based laminate | 42 | Ni | none | | |
| | 207 | Ni | pos. | +/± | + |
| cellulose triacetate | 42 | Ni | pos. | ± | + |
| polyethylene (Lupolen 2710HX)BASF | 662 | Ni | neg. | − | +/± |
| | 2592 | Ni | pos. | − | + |
| polyethylene glycolterephtalate ("Mylar", Dupont) | 48 | Ni | neg. | − | ± |
| | 96 | Ni | none | | |
| | 192 | Ni | none | | |
| | 2592 | Ni | pos. | − | ± |

No efforts were made during these tests to obtain an optimal adhesion. However, the adhesion can be improved by know means, for example by means of mechanical or chemical roughening, or by treatment with a swelling agent, etc.

The polymers of the p-xylylene-type ("Parylene N, C and D of Union Carbide) have been found to be particularly useful because they can be deposited on several types of supports, for example glass, by means of a chemical deposition process at a low temperature, for example room temperature, starting from the dimer.

The invention will be further explained by means of the following embodiments.

EXAMPLE 1

A microscope slide (24×76 mm$^2$) is provided with a 2 μm thick poly-p-xylylene coating by pyrolysing di-p-xylylene in the gaseous phase at a reduced pressure at 650° C. and by condensing the formed reactive monomer on the substrate at room temperature, as described in United States Patent Specification No. 3,246,627. The sample thus obtained is exposed at a distance of 40 cm behind a negative under a high-pressure mercury lamp (Philips SP 500 W lamp) for 25 minutes. The exposed surface is photo-oxidized by the oxygen present in the air, the unexposed surface areas remaining unaltered. Nucleation is then effected by:

(a) immersing the sample for 1 minute in a solution containing per liter:
   1 g $SnCl_2.2H_2O$
   1 ml HCl (37%)
   1 g Na laurylsulphate,
(b) rinsing the sample thereafter for 1 minute with water, and
(c) immersing the sample for 1 minute in a solution containing per liter:
   0.1 g $PdCl_2$
   2 ml 37% HCl.

The nucleated sample is now immersed for 5 minutes in a solution containing per liter:
   25 g $NiSO_4.6H_2O$
   50 g $Na_4P_2O_7.10H_2O$ (tetra sodium pyrophosphate)
   23 ml 25% $NH_4OH$
   2.2 g $BH_3$, NH $(C_2H_5)_2$ (di-ethylaminoborane)
causing nickel to be deposited in the unexposed areas of the sample whereas the exposed areas remain uncoated. The nickel pattern thus obtained has a very good adhesion to the substrate.

EXAMPLE 2

A 1 mm thick sheet (25×50 cm$^2$) of polymethyl methacrylate is exposed behind a negative under a high pressure mercury lamp for 13 minutes at a distance of 15 cm. In the same manner as described in Example 1 the sample is nucleated and provided with a nickel pattern. The positive nickel pattern has a very good adhesion to the substrate.

EXAMPLE 3

Polyimide film (Kapton H of Dupont), 120 μm thick, is exposed behind a negative under a high-pressure mercury lamp (SP 500 W) for 40 minutes at a distance of 50 cm. Nuclei are produced in the same manner as in Example 1; however, nickel plating is carried out during 5–10 minutes in a solution containing per liter:
   25 g $NiSO_4.6H_2O$
   50 g $Na_4P_4O_7.10H_2O$
   23 ml 25% $NH_4OH$
   1.5 g di-methylaminoborane.

A positive nickel pattern having a reasonable to good adhesion to the substrate is deposited.

EXAMPLE 4

Poly-chloro-p-xylylene is provided on glass in the same manner as the poly-p-xylylene, however starting from dichloro-di-p-xylylene. The assembly is exposed through a mask during 80 minutes with a SP 500 W lamp at a distance of 15 cm. The nuclei are obtained in the manner described in Example 1. Copper is now deposited by immersion during 5 minutes in an aqueous solution containing per liter:
   0.1 mole $CuSO_4$
   0.11 mole Na salt of ethylenediaminetetraacetic acid
   0.15 mole NaOH
   0.1 mole formaldehyde.

The copper is deposited in the unexposed areas only, the adhesion of the Cu to the polychloro-p-xylylene being poorer than the adhesion of the nickel in the preceding examples.

What is claimed is:

1. A method of forming a metal pattern on a substrate of which at least one major surface is formed of a synthetic resin comprising:
   (a) irradiating a synthetic resin surface of said substrate with actinic light in accordance with the negative of the desired metal pattern in the presence of oxygen so as to form peroxide groups on the exposed surface of the synthetic resin;
   (b) contacting the irradiated synthetic resin surface with a solution or dispersion of an oxide or salt of a metal capable of occurring in a higher valence state then present in said oxide or salt, said oxide or salt being capable of reducing noble metal ions to metal, thereby rendering the irradiated areas of said synthetic resin surface inactive;
   (c) contacting the thus treated synthetic resin surface with a solution containing noble metal ions thereby forming a nuclear noble metal image in a pattern of the desired metal pattern; and
   (d) intensifying said nuclear noble metal image by an electroless metal deposition so as to form the desired metal pattern.

2. The method of claim 1 wherein the substrate consists of a support material upon which is present a coating of p-xylylene polymer formed by means of vapor deposition.

* * * * *